(12) United States Patent
Fujimoto

(10) Patent No.: US 9,607,686 B2
(45) Date of Patent: Mar. 28, 2017

(54) SEMICONDUCTOR MEMORY DEVICE

(71) Applicant: KABUSHIKI KAISHA TOSHIBA, Tokyo (JP)

(72) Inventor: Yukihiro Fujimoto, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/836,711

(22) Filed: Aug. 26, 2015

(65) Prior Publication Data

US 2016/0071575 A1 Mar. 10, 2016

(30) Foreign Application Priority Data

Sep. 10, 2014 (JP) .................. 2014-184396

(51) Int. Cl.
| | | |
|---|---|---|
| *G11C 11/419* | (2006.01) | |
| *G11C 11/418* | (2006.01) | |
| *H01L 27/11* | (2006.01) | |
| *G11C 5/02* | (2006.01) | |
| *G11C 8/08* | (2006.01) | |
| *G11C 11/417* | (2006.01) | |
| *G11C 11/41* | (2006.01) | |
| *G11C 29/04* | (2006.01) | |
| *G11C 29/18* | (2006.01) | |

(52) U.S. Cl.
CPC ............ *G11C 11/419* (2013.01); *G11C 5/025* (2013.01); *G11C 8/08* (2013.01); *G11C 11/417* (2013.01); *G11C 11/418* (2013.01); *H01L 27/1116* (2013.01); *G11C 11/41* (2013.01); *G11C 2029/0411* (2013.01); *G11C 2029/1804* (2013.01)

(58) Field of Classification Search
CPC ....... G11C 5/025; G11C 11/41; G11C 11/413; G11C 11/418; G11C 11/419; H01L 27/1116
See application file for complete search history.

(56) References Cited

U.S. PATENT DOCUMENTS 5,883,826 A * 3/1999 Wendell ............. G06F 12/1054
365/230.03
5,903,022 A * 5/1999 Takashima ............... G11C 8/14
257/296

(Continued)

FOREIGN PATENT DOCUMENTS

JP H10-302474 A 11/1998

*Primary Examiner* — Allison P Bernstein
(74) *Attorney, Agent, or Firm* — Patterson & Sheridan, LLP

(57) ABSTRACT

A semiconductor memory device includes data path circuits and control circuits alternately disposed along a first direction. A first metal layer is disposed on the data path circuits and control circuits. Each of data path circuits includes a memory cells disposed in rows along the first direction and columns along a second direction crossing the first direction and a read/write circuit disposed at an end of the columns of memory cells. At least one pair of adjacent columns of memory cells has an electrical separation between the gate polysilicon layer the pair of adjacent memory cell columns—that is, gate conductor layer of the adjacent memory columns are electrically distinct. A word line in the first metal layer is segmented along the first direction into separately addressable portions.

19 Claims, 3 Drawing Sheets

(56) References Cited

U.S. PATENT DOCUMENTS 5,986,917 A * 11/1999 Lee .................... G11C 8/14
365/201
7,277,339 B2 * 10/2007 Edahiro ................ G11C 7/12
257/E21.69

* cited by examiner

SEMICONDUCTOR MEMORY DEVICE

CROSS-REFERENCE TO RELATED APPLICATION

This application is based upon and claims the benefit of priority from Japanese Patent Application No. 2014-184396, filed Sep. 10, 2014, the entire contents of which are incorporated herein by reference.

FIELD

Embodiments described herein relate generally to a semiconductor memory device.

BACKGROUND

A configurable semiconductor device in which a semiconductor element, such as a transistor, is formed on a semiconductor substrate so as to allow a metal wiring layer to be arbitrarily disposed so as to connect various elements disposed on the semiconductor substrate is known. This type of configurable semiconductor device can be formed into a custom-made system on chip (SoC) by arrangement of wirings in the metal wiring layer. By this process, it is possible to shorten a design and development period of new SoC devices, and greatly reduce design and development cost.

A configurable semiconductor memory device which applies this configurable metal layer to a memory device has been proposed.

However, a configurable semiconductor memory device in the related art comprises a memory macro cell including a memory cell array, an address decoder, a read/write circuit and a control circuit, and as such access in byte units is a prerequisite for these devices. One byte is usually eight bits. However, a byte unit is often set to nine bits by adding a parity bit for error correction purposes. Therefore, the memory macro cell operates with nine bits as a byte unit in some cases.

However, operation does not have to be performed in a byte unit, and the byte unit is not limited to nine bits. For example, in order to provide a redundant circuit, at least one redundant bit is required to be available for this purpose, such that the access unit may have to be ten bits. When a memory macro cell having a nine bit width is prepared in advance in a configurable memory device design, and it is subsequently desired to use ten bits (to provide the redundant bit), the number of bits in one memory cell array of the configurable memory device design is insufficient, and consequently at least one extra memory cell array in the configurable memory device design would be required to be used to provide the redundant bit space. However, among the 18 bits, which would be the total number of bits in two memory cell arrays in these scenario, only ten bits are actually used, such that nearly a half of memory capacity is wasted.

When a memory macro cell of a ten bit width is prepared to take into account the possible requirement of a redundant bit in the configurable memory device, then in many circumstances when less than ten bits are required, the redundant circuit is not used. As such, additional one bit portion of the memory macro cell is not used, and utilization efficiency of the memory cell is reduced.

DETAILED DESCRIPTION

Embodiments provide a semiconductor memory device which has improved utilization efficiency of each memory cell in a memory cell array.

According to a first embodiment, a semiconductor memory device includes a plurality of data path circuits and control circuits, which are alternately disposed along a first direction. A first metal layer is disposed on the plurality of data path circuits and control circuits. Each of the plurality of data path circuits includes a plurality of memory cells disposed in a plurality of rows along the first direction and a plurality of columns along a second direction crossing the first direction, and a read/write circuit disposed at an end of the plurality of columns. A gate polysilicon layer of memory cells in a column of memory cells in a data path circuit is electrically separated from a gate polysilicon layer of memory cells in an adjacent column of memory cells in the data path circuit. A word line in the first metal layer is segmented along the first direction into separately addressable portions.

In general, according to one embodiment, a semiconductor memory device includes: an underlying layer that forms a plurality of data path circuits and a plurality of control circuits, which are alternately disposed along a plurality of word lines; and a metal layer that is disposed above the underlying layer and is capable of arbitrarily changing disposition of wiring. Each of the plurality of data path circuits includes: a memory cell array and a read/write circuit that are disposed along a plurality of bit lines extending in a direction intersecting the plurality of word lines, and a plurality of separator portions that are disposed in the memory cell array and the read/write circuit in correlation with each of the plurality of bit lines, and variably control an accessible bit width of the semiconductor memory device.

Hereinafter, exemplary embodiments will be described with reference to drawings. In a following description, specific configurations and operations in a semiconductor memory device will be described for purposes of explanation of various aspects of the present disclosure; however, various other configurations and operations may have been omitted in the following description even though present or preformed in the semiconductor memory device of the present disclosure. However, those of ordinary skill in the art will recognized these omitted configurations and operations are also included within a scope of the example embodiment and present disclosure.

Figure 1:
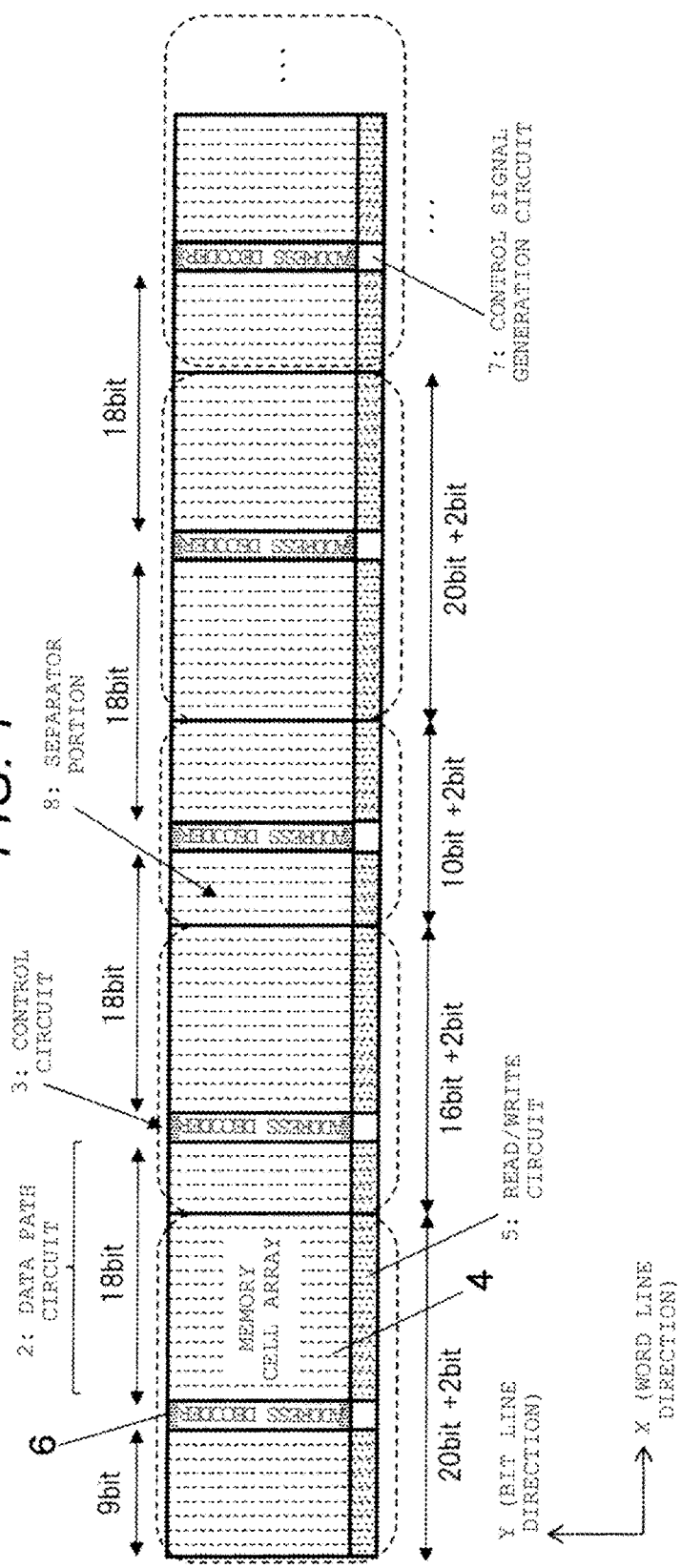
FIG. 1 is a diagram which shows a schematic layout disposition of a semiconductor memory device according to an embodiment.

FIG. 1 is a diagram which shows a schematic layout of a semiconductor memory device 1 according to a first embodiment. The semiconductor memory device 1 includes a plurality of data path circuits 2 and a plurality of control circuits 3, which are alternately disposed along a plurality of word lines (not specifically depicted in FIG. 1) extending along the left-right page direction of FIG. 1. For example, 128 word lines are arrayed along the up-down page direction of FIG. 1. That is, word lines cross the memory cell arrays in each data path circuit 2

Each data path circuit 2 includes a memory cell array 4 and also a read/write circuit 5 which is disposed crossing a plurality of bit lines that extend in a direction intersecting the word lines (e.g., the bit line direction is the top-bottom page direction in FIG. 1).

The memory cell array 4 is, for example, a plurality of static random access memory (SRAM) cells in a matrix arrangement. In an example of FIG. 1, there are 18 bit lines for each memory cell array 4 (e.g., 18 columns of memory cells in each memory cell array 4), and it is possible to store data of maximum 18 bits. In each memory cell array 4, a plurality of word lines are disposed. For example, each memory cell in a column can have a single word line attached thereto. When a one of the word lines is activated, access is performed on the memory cell connected to the activated word line.

The read/write circuit 5 is provided in conjunction with each memory cell array 4, and performs a writing of data into the memory cell array 4 and a reading of data from the memory cell array 4. A control signal line (which is not shown) is disposed in the read/write circuit 5, and the reading or the writing operation is performed in synchronization with logic of a control signal on the control signal line. The control signal is, for example, a chip enable signal, a write enable signal, a read enable signal, and the like.

Each control circuit 3 includes an address decoder 6 and a control signal generation circuit 7. The address decoder 6 may be disposed between adjacent memory cell arrays 4 in the word line direction and may extend along a direction (e.g., the bit line direction) intersecting the plurality of word lines. The control signal generation circuits 7, for example, may be disposed at an end (a bit line direction end) of the address decoders 6. The control signal generation circuits, for example, may be disposed between adjacent read/write circuits 5 in the word line direction.

The address decoder 6 decodes a signal on the plurality of word lines. A decoded signal is supplied to the control signal generation circuit 7. The control signal generation circuit 7 generates various control signals based on the decoded signal.

The data path circuit 2 includes a separator portion 8 between each adjacent pair of bit lines and between an end bit line and an address decoder 6 of the memory cell array. In an example of FIG. 1, since 18 bit lines are disposed in one data path circuit 2, each data path circuit 2 includes 18 separator portions 8. Each separator portion 8 is provided so as to variably control a bit width of an SRAM.

Each separator portion 8 is provided in the memory cell array 4 and the read/write circuit 5 in correlation with each of the plurality of bit lines. Specifically, each separator portion 8 may be used to cut the plurality of word lines (form word line segments which are electrically distinct) in the memory cell array 4. In addition, each separator portion 8 may be used to cut the control signal line (form control line segments which are electrically distinct) in the read/write circuit 5. When one of the separator portions 8 cuts the plurality of word lines in the memory cell array 4, a control signal line is also cut in the corresponding read/write circuit 5. In this manner, each separator portion 8 performs a cutting on the word lines in the memory cell array 4 and a cutting on the control signal line in the read/write circuit 5 in conjunction.

When one of the separator portions 8 is used to cut the plurality of word lines and the control signal line, the memory cell array 4 is divided into two portions at the selected cutting position (the selected separator portion 8), and a SRAM of a bit width corresponding to the position at which the selected separator portion 8 is located is generated. For example, in FIG. 1, it is shown that a separator portion 8 after the 13$^{th}$ bit line from the left in the first full width (18 bit width, as depicted in FIG. 1) data path circuit 2 on the leftmost side is used to cut the word lines and the control signal line, and thus an SRAM in which two bits (as a redundant circuit) are added to a 20 bit width obtained by adding 9 bit wide and 11 bit wide memory cell array portions is generated (22 total bit width). Similarly, a separator portion 8 in a second full width (18 bit width, as depicted in FIG. 1) data path circuit 2 from the left is used to cut the word lines and the control signal line after the 13$^{th}$ bit line from the left in this second data path circuit 2 in FIG. 1. Consequently, a SRAM in which two bits as a redundant circuit are added to a 16 bit width obtained by adding a 5 bit width portion (from the first full width data path circuit 2) and a 11 (+2) bit width portion from the second full width data path circuit 2 is generated. In a similar manner, an SRAM in which two bits as a redundant circuit are added to a 10 bit width to form a 10 (+2) SRAM is generated on the right side of FIG. 1 of the 16+2 bit width SRAM, and another SRAM is generated to the right side of the 10+2 SRAM in FIG. 1, this one having two bits as a redundant circuit added to a 20 bit width data path (20+2 SRAM).

In this manner, an SRAM of arbitrary bit width may be generated in the plurality of memory cell arrays 4 which are aligned along the word line. The arbitrary bit width SRAM can be formed by separating the word line and the control signal line using the separator portions 8 in each data path circuit 2. Moreover, the SRAM of an arbitrary bit width may be generated by mixing SRAMs of different bit widths. Thus, a device using a plurality of SRAMs with different bit widths may be formed.

FIG. 1 shows an example having a plurality of data path circuits 2 and a plurality of control circuits 3 alternately disposed in a row direction along the plurality of word lines. However, a plurality of such rows may be disposed in a bit line direction. In this case, a bit width of an SRAM may be variably adjusted in an arbitrary manner for each data path circuit 2 in each row.

The semiconductor memory device 1 according to the first embodiment is configurable and may be referred to as being metal configurable. That is, the underlying layer which generates the plurality of data path circuits 2 and the plurality of control circuits 3 is built on a semiconductor substrate in advance and changes in the disposition of wiring in a metal wiring layer ultimately disposed above the underlying layer provide for arbitrarily adjusting of the configuration of the semiconductor memory device 1 for end use. Here, the configuration refers to the maximum number of words per access of the SRAM, the number of bits per word, that is, a bit width, the number of input and output ports, and the like.

When performing metal wiring, the separator portion 8 described above can be used to select whether or not to cut the word lines made in a metal wiring layer. In this manner, in the first embodiment, when performing the disposition of wiring of the metal wiring layer, a selection of whether or not to cut the word lines and the control signal line using the separator portion 8 is performed by formation of a metal wiring layer (or layers) disposed above the memory cells and associated control circuits.

Figure 2:
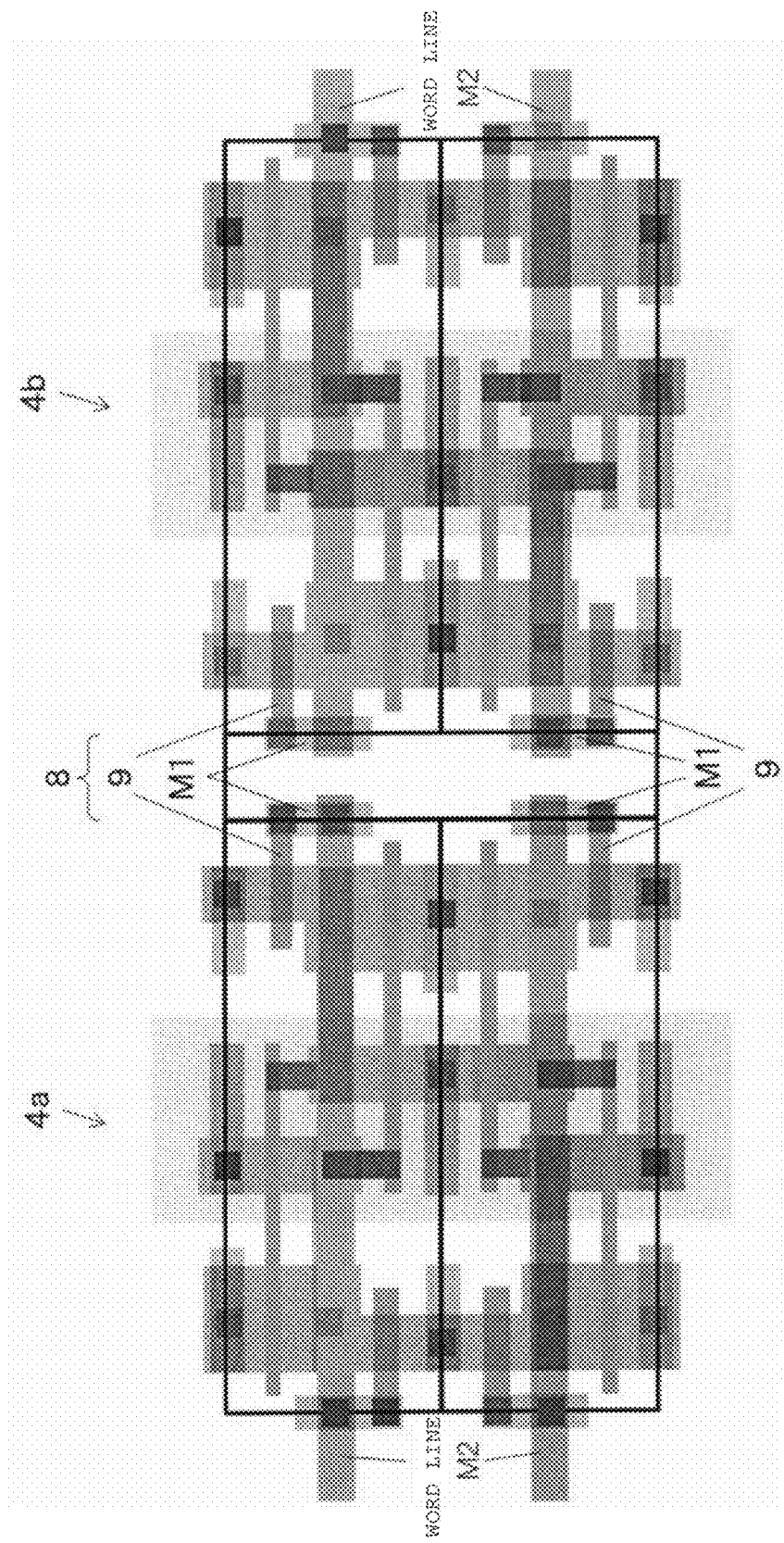
FIG. 2 is a layout pattern diagram which shows an example of a layout of a memory cell array of FIG. 1.

FIG. 2 is a layout pattern diagram which shows an example of a layout of the memory cell array 4 in FIG. 1. The separator portion 8 is disposed at a center of FIG. 2, a first memory cell array 4a is disposed on a right side of the separator portion 8, and a second memory cell array 4b is disposed on a left side of the separator portion 8. The first and the second memory cell arrays 4a and 4b are disposed along a direction (e.g., X direction of FIG. 2) in which the word lines extend, and the bit lines are disposed in a direction (e.g., Y direction of FIG. 2) intersecting the word lines. However, the bit lines are omitted from the depiction in FIG. 2 for clarity. In addition, the four regions surrounded by a thick solid line in FIG. 2 are each a memory cell, respectively.

In FIG. 2, the metal wiring disposed above the semiconductor substrate has a two-layer structure, the word lines are on a second metal wiring level M2, and the metal wiring other than the word lines are on a first metal wiring level M1. As described above, the first embodiment is "metal configurable," so that the metal wiring layers may be arbitrarily disposed on the underlying memory cell arrays the other associated device layers which are built on the semiconductor substrate before the formation of the overlying metal wiring layers.

In an example of FIG. 2, when forming wiring of word lines on the second metal wiring level M2, the word lines are cut (segmented) by the separator portion 8. That is, word lines of the first and second memory cell arrays 4a and 4b are not necessarily connected to each other in a fixed manner, such that the first memory cell array 4a and the second memory cell array 4b may be used as a separate SRAM. That is, the first (4a) and second (4b) memory cell arrays can be separately addressable and use word lines which are not directly connected to each other.

The word lines are connected to a gate polysilicon layer 9 on an underlying layer through a contact (an inter-level connection). Therefore, if the gate polysilicon layers 9 of the first and the second memory cell arrays 4a and 4b are connected to each other, then even if the respective word lines were to be cut (segmented), gates of the first and the second memory cell arrays 4a and 4b would still be electrically connected to each other (via the gate polysilicon layers 9). Therefore, on the underlying layer (a memory cell array layer of the substrate) in the first embodiment, the separator portion 8 also cuts (segments) the gate polysilicon layers 9 extending in the X direction. Accordingly, by this arrangement, it is possible to prevent the gates of the first and the second memory cell arrays 4a and 4b from being electrical connected to each other if such an arrangement is so desired.

In FIG. 2, there is at least one separator portion 8 for cutting the word lines in the data path circuit 2. Additional, separator portions 8 may be similarly incorporated.

Figure 3:
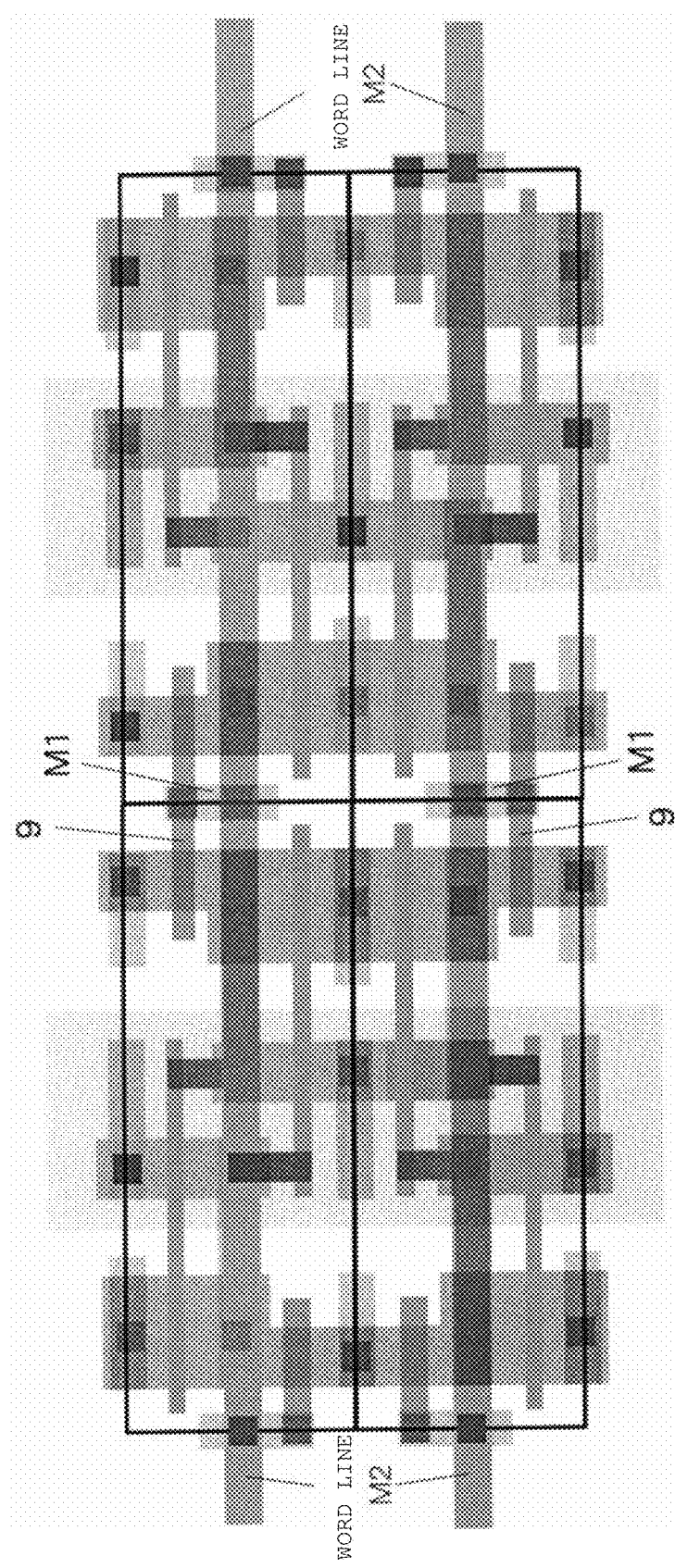
FIG. 3 is a layout pattern diagram according to a comparative example.

FIG. 3 is a layout pattern diagram according to a comparative example. The comparative example of FIG. 3 does not include a separator portion 8. Since there is no separator portion 8 in FIG. 3, it is not possible to cut the word lines in the memory cell array 4. For this reason, the memory cell array 4 has to be used as an SRAM of a large bit width, and when using the memory cell array as an SRAM of a small bit width, a memory capacity corresponding to a remaining bit width has to be wasted. In contrast, in FIG. 2, it is possible to generate an SRAM of a desired bit width by separating the word line using the separator portion 8 at a position corresponding to a desired bit width. Moreover, according to the first embodiment, it is possible to generate a plurality of SRAMs of different bit widths by using a plurality of separator portions 8.

As described above, the metal configurable semiconductor memory device 1 includes a plurality of separator portions 8 in conjunction with each bit line in the data path circuit 2, and selection as to whether or not to cut the word lines and the control signal line with each separator portion 8 is made when forming metal wiring levels, it is thus possible to control a bit width of an SRAM in an arbitrary manner at time of upper level metal wiring formation.

In addition, since the plurality of the data path circuits 2 and the plurality of control circuits 3 are alternately disposed along the plurality of word lines, it is possible to generate a plurality of different SRAMs having different bit widths in the same device or on the same substrate.

As a result, the utilization efficiency of the memory cell array 4 is increased, and accordingly, extra memory cell arrays 4 do not need to be used for provided extra bit space/widths. Accordingly, it is possible to reduce a chip area of the semiconductor memory device 1. In addition, according to the first embodiment, since a bit width may be arbitrarily adjusted for incorporating a redundant bit or bits, limitations on adding the redundant bit(s) are decreased. Therefore, it is also possible to improve a yield of a chip by adding the number of redundant bits corresponding to the sufficient number of bits to potentially compensate for the occasional bad memory cell or memory cell array.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   a plurality of data path circuits and control circuits, which are alternately disposed along a first direction; and
   a first metal layer on the plurality of data path circuits and control circuits, wherein
   each of the data path circuits includes:
      a plurality of memory cells disposed in a plurality of rows along the first direction and a plurality of columns along a second direction crossing the first direction, and
      a read/write circuit disposed at an end of the plurality of columns;
   a gate polysilicon layer of memory cells in a column of memory cells in a data path circuit is electrically separated from a gate polysilicon layer of memory cells in an adjacent column of memory cells in the data path circuit; and
   a word line in the first metal layer is segmented along the first direction into separately addressable portions.

2. The semiconductor memory device according to claim 1, wherein each of the control circuits includes:
   an address decoder configured to decode a signal on a plurality of word lines extending in the first direction, and
   a control signal generation circuit configured to generate a control signal based on the signal decoded by the address decoder, and
   the read/write circuit is configured to perform reading and writing on memory cells based on the control signal.

3. The semiconductor memory device according to claim 1, wherein the data path circuits form static random access memory (SRAM) arrays.

4. The semiconductor memory device according to claim 1, wherein a plurality of word lines in the first metal layer is segmented along the first direction into separately addressable portions.

5. The semiconductor memory device according to claim 1, wherein each of the plurality of data path circuits has a same bit width.

6. The semiconductor memory device according to claim 1, further comprising:
a second metal layer on the data path circuits and the control circuits, the second metal layer including a plurality of bit lines extending in the second direction, each bit line electrically connecting a column of memory cells in the plurality of columns.

7. The semiconductor memory device according to claim 1, wherein each pair of adjacent columns of memory cells in each data path circuit has an electrical separation between respective gate polysilicon layers of each pair of adjacent columns of memory cells.

8. A semiconductor memory device, comprising:
a first plurality of memory cells formed on a substrate and disposed in rows along a first direction and columns along a second direction;
a second plurality of memory cells formed on the substrate and disposed in rows along the first direction and columns along the second direction, the rows of the second plurality of memory cells being aligned with the rows of the first plurality of memory cells;
a first address decoder formed on the substrate between the first and second plurality of memory cells;
a first read/write circuit formed on the substrate adjacent to an end of the columns of the first plurality of memory cells;
a second read/write circuit formed on the substrate adjacent to an end of the columns of the second plurality of memory cells; and
a control signal generation circuit formed on the substrate between the first and second read/write circuits, wherein
each column of memory cells in the first and second plurality of memory cells has a gate conductor layer that is electrically separated from a gate conductor layer of adjacent columns of memory cells.

9. The semiconductor memory device according to claim 8, further comprising:
a first plurality of word lines formed in a first metal layer above the substrate, extending in the first direction, and corresponding to each row of the first plurality of memory cells;
a second plurality of word lines formed in the first metal layer above the substrate, extending in the first direction, and corresponding to each row of the second plurality of memory cells; and
a plurality of bit lines formed in a second metal layer above the substrate, extending in the second direction, and corresponding to each column of the first and second plurality of memory cells.

10. The semiconductor memory device according to claim 9, wherein each word line in the first plurality of word lines is segmented along the first direction into electrically distinct first and second portions.

11. The semiconductor memory device according to claim 10, wherein the second portion of each word line in the first plurality of word lines is electrically connected to a corresponding word line in the second plurality of word lines.

12. The semiconductor memory device according to claim 8, further comprising:
a third plurality of memory cells formed on the substrate and disposed in rows along the first direction and columns along the second direction, the rows of the third plurality of memory cells being aligned with the rows of the first plurality of memory cells; and
a second address decoder formed on the substrate between the second and third plurality of memory cells.

13. The semiconductor memory device according to claim 12, further comprising:
a first plurality of word lines formed in a first metal layer above the substrate, extending in the first direction, and corresponding to each row of the first plurality of memory cells;
a second plurality of word lines formed in the first metal layer above the substrate, extending in the first direction, and corresponding to each row of the second plurality of memory cells;
a third plurality of word lines formed in the first metal layer above the substrate, extending in the first direction, and corresponding to each row of the third plurality of memory cells;
a plurality of bit lines formed in a second metal layer above the substrate, extending in the second direction, and corresponding to each column of the first, second, and third plurality of memory cells, wherein
each word line in the first plurality of word lines is segmented along the first direction into electrically distinct first and second portions,
each word line in the second plurality of word lines is segmented along the first direction into electrically distinct third and fourth portions,
the second portion of each word line in the first plurality of word lines is electrically connected to a corresponding third portion of a word line in the second plurality of word lines, and
the fourth portion of each word line in the second plurality of word lines is electrically connected to a corresponding word line in the third line in the third plurality of word lines.

14. The semiconductor memory device according to claim 8, wherein the first and second plurality of memory cells comprise static random access memory (SRAM) cells.

15. The semiconductor memory device according to claim 8, wherein the first plurality of memory cells has eighteen columns and one-hundred-twenty-eight rows.

16. A method of making a semiconductor memory device, comprising:
forming a first plurality of memory cells on a substrate, the first plurality of memory cells being disposed in rows along a first direction and columns along a second direction;
forming a second plurality of memory cells on the substrate, the second plurality of memory cells being disposed in rows along the first direction and columns along the second direction, the rows of the second plurality of memory cells being aligned with the rows of the first plurality of memory cells;
forming a first address decoder on the substrate between the first and second plurality of memory cells;
forming a first read/write circuit on the substrate adjacent to an end of the columns of the first plurality of memory cells;
forming a second read/write circuit on the substrate adjacent to an end of the columns of the second plurality of memory cells; and
forming a control signal generation circuit on the substrate between the first and second read/write circuits, wherein
each column of memory cells in the first and second plurality of memory cells has a gate conductor layer that is electrically separated from a gate conductor layer of adjacent columns of memory cells.

17. The method of claim 16, further comprising:

forming a first plurality of word lines in a first metal layer above the substrate, the first plurality of word lines extending in the first direction and corresponding to each row of the first plurality of memory cells;

forming a second plurality of word lines in the first metal layer above the substrate, the second plurality of word lines extending in the first direction and corresponding to each row of the second plurality of memory cells; and forming a plurality of bit lines in a second metal layer above the substrate, the plurality of bit lines extending in the second direction and corresponding to each column of the first and second plurality of memory cells.

18. The method of claim 17, wherein each word line in the first plurality of word lines is segmented along the first direction into electrically distinct first and second portions.

19. The method of claim 18, wherein the second portion of each word line in the first plurality of word lines is electrically connected to a corresponding word line in the second plurality of word lines.

* * * * *